(12) United States Patent
Lee et al.

(10) Patent No.: US 7,764,013 B2
(45) Date of Patent: Jul. 27, 2010

(54) DISPLAY DEVICE AND MANUFACTURING METHOD

(75) Inventors: Dong-won Lee, Gyeonggi-do (KR); Jung-soo Rhee, Seoul (KR); Jin-koo Chung, Gyeonggi-do (KR); Jianpu Wang, Gyeonggi-do (KR); Song-mi Hong, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 158 days.

(21) Appl. No.: 11/478,760

(22) Filed: Jun. 29, 2006

(65) Prior Publication Data

US 2007/0035242 A1   Feb. 15, 2007

(30) Foreign Application Priority Data

Jun. 29, 2005   (KR)   ...................... 10-2005-0056654

(51) Int. Cl.
*H01J 1/62*   (2006.01)
*H01J 63/04*   (2006.01)

(52) U.S. Cl. ...................................... 313/506; 313/509

(58) Field of Classification Search ......... 313/498–512; 428/690–691
See application file for complete search history.

(56) References Cited

U.S. PATENT DOCUMENTS

| | | | |
|---|---|---|---|
| 6,844,120 B2 | 1/2005 | Chen et al. | |
| 2003/0141500 A1 | 7/2003 | Amundson et al. | |
| 2004/0021413 A1* | 2/2004 | Ito et al. | 313/504 |
| 2004/0056588 A1* | 3/2004 | Nozawa | 313/504 |
| 2005/0012105 A1 | 1/2005 | Yamazaki et al. | |
| 2005/0112341 A1* | 5/2005 | Ito et al. | 428/209 |
| 2005/0116632 A1* | 6/2005 | Funamoto et al. | 313/506 |

FOREIGN PATENT DOCUMENTS

| | | |
|---|---|---|
| CN | 1496203 | 5/2004 |
| CN | 1610461 | 4/2005 |
| JP | 2001-085162 | 3/2001 |
| JP | 2001-237067 | 8/2001 |
| JP | 2001-237083 | 8/2001 |
| JP | 2003-270422 | 9/2003 |
| JP | 2004-268028 | 9/2004 |

(Continued)

OTHER PUBLICATIONS

Patent Abstracts of Japan, Publication No. 2003-270422, Sep. 25, 2003, 1 p.

(Continued)

*Primary Examiner*—Toan Ton
*Assistant Examiner*—Zachary Snyder
(74) *Attorney, Agent, or Firm*—Innovation Counsel LLP

(57) ABSTRACT

The invention provides a display apparatus comprising: a plurality of thin film transistors; a protective film formed on the thin film transistor; a plurality of pixel electrodes formed on the protective film and electrically connected with the thin film transistors; a partition wall layer partitioning the pixel electrodes adjacent to each other, the partition wall layer including a main exposure portion exposing the pixel electrode and a sub-exposure portion protruded and extended from the main exposure portion whereby the problem of non-uniform coating of ink in the corners of pixel electrodes is overcome.

15 Claims, 11 Drawing Sheets

FOREIGN PATENT DOCUMENTS

| | | |
|---|---|---|
| JP | 2004247058 A | 9/2004 |
| JP | 2005-12181 | 1/2005 |
| JP | 2005-158708 | 6/2005 |
| JP | 2005197027 A | 7/2005 |
| JP | 2005203215 A | 7/2005 |
| JP | 2006134624 A | 5/2006 |
| JP | 2006310106 A | 11/2006 |
| KR | 100263771 B1 | 5/2000 |
| KR | 100312922 B1 | 10/2001 |
| KR | 1020010098263 A | 11/2001 |
| KR | 1020020026843 A | 4/2002 |
| KR | 10-2004-0020783 | 3/2004 |
| KR | 1020040101003 A | 12/2004 |
| WO | 99/10862 | 3/1999 |

OTHER PUBLICATIONS

Patent Abstracts of Japan, Publication No. 2005-012181, Jan. 13, 2005, 1 p.

Korean Patent Abstracts, Publication No. 1020040020783, Mar. 9, 2004, 1 p.

\* cited by examiner

DISPLAY DEVICE AND MANUFACTURING METHOD

CROSS-REFERENCE TO RELATED APPLICATION

This application claims priority from Korean Patent Application No. 2005-0056654, filed on Jun. 29, 2005, in the Korean Intellectual Property Office, the disclosure of which is incorporated herein by reference.

BACKGROUND OF INVENTION

1. Field of Invention

The present invention relates to a display device and a method of manufacturing the same, and more particularly, to a display device in which a partition wall layer is included between pixel electrodes.

2. Description of the Related Art

Recently, an organic light emitting diode (OLED) device has attracted attention and interest in the industry of flat panel display devices because of its low-power requirements, light weight, slim shape, wide viewing angle, high-speed response, and the like. An OLED is classified as either a passive or active matrix type. The passive matrix type can be fabricated through a simplified manufacturing process, but the power consumption rapidly increases as the display area and resolution increase. Thus, the passive matrix type is applied mainly to a small-size display device. In contrast, the active matrix type can be applied to a large area screen and high-resolution device although a complicated fabrication process is involved.

In the active matrix OLED, a thin film transistor is connected to each pixel region and the light transmission of the light-emitting layer is controlled for each individual pixel region. A pixel electrode is disposed in each pixel region. Each pixel electrode is electrically separated from its neighboring pixel electrodes so as to be driven independently. In addition, a partition wall is formed between neighboring pixel regions having a greater height than that of the pixel regions. The partition wall functions to prevent short-circuit between the pixel electrodes and isolates each pixel region. Generally, this partition wall is formed in a rectangular shape along the periphery of a pixel electrode.

An ink is sprayed through an inkjet on the pixel electrode with the partition wall placed in-between. Due to the surface tension of fluid, the ink tends to maintain a spherical shape. Because of this phenomenon, the ink cannot be properly dropped into the corner areas of the rectangular partition wall. This non-uniform coating of ink leads to defective pixels and short-circuits between the pixel electrode and the cathode or common electrode, and consequently results in a problem that the image signal fails to be appropriately transmitted. In addition, if different colored inks are dropped on the partition wall and mixed, a color-mixing may occur between pixels.

SUMMARY OF THE INVENTION

Accordingly, it is an aspect of the present invention to provide a display device and a method of manufacturing the same, in which the light-emitting layer is formed in a uniform fashion, which prevents color-mixing between pixels and which overcomes the problem of non-uniform coating of ink in the corners of pixel electrodes. The display device comprises a plurality of thin film transistors; a protective film formed on the thin film transistor; a plurality of pixel electrodes formed on the protective film and electrically connected with the thin film transistors, a partition wall layer partitioning the pixel electrodes adjacent to each other including a main exposure portion exposing the pixel electrode and a sub-exposure portion protruded and extended from the main exposure portion having a stepped portion formed in at least a part of an edge area thereof; and a light-emitting layer formed on the pixel electrode with the stepped portion placed in-between to emit the same color. According to another aspect of the invention, the partition wall layer has a depressed portion and the light-emitting layers formed on the pixel electrodes adjacent to the depressed portion emit different colors from each other.

The foregoing and other aspects of the present invention can be achieved by providing a method of manufacturing a display device, comprising: forming a plurality of thin film transistors and a protective film on a substrate; forming a plurality of pixel electrodes on the protective film so as to be electrically connected with the thin film transistors; forming a partition wall layer partitioning the pixel electrodes adjacent to each other, the partition wall layer having a main exposure portion exposing the pixel electrode and a sub-exposure portion protruded and extended from the main exposure portion; and forming a light-emitting layer on the pixel electrode. The sub-exposure portion is formed such that the area thereof is about 5~15% of that of the main exposure portion and is provided with a stepped portion formed in at least a part of an edge of the partition wall layer. The light-emitting layer is printed towards the stepped portion and is formed using an inkjet. According to an aspect of the present invention, the method further comprises forming a cathode or common electrode on the light-emitting layer; the partition wall layer having an exposure area at least one corner of which is protruded and extended, has a planar form and is curved.

BRIEF DESCRIPTION OF THE DRAWINGS

The above and/or other aspects and advantages of the prevent invention will become apparent and more readily appreciated from the following description of the exemplary embodiments, taken in conjunction with the accompanying drawings, in which.

DETAILED DESCRIPTION OF THE INVENTION

Figure 1:
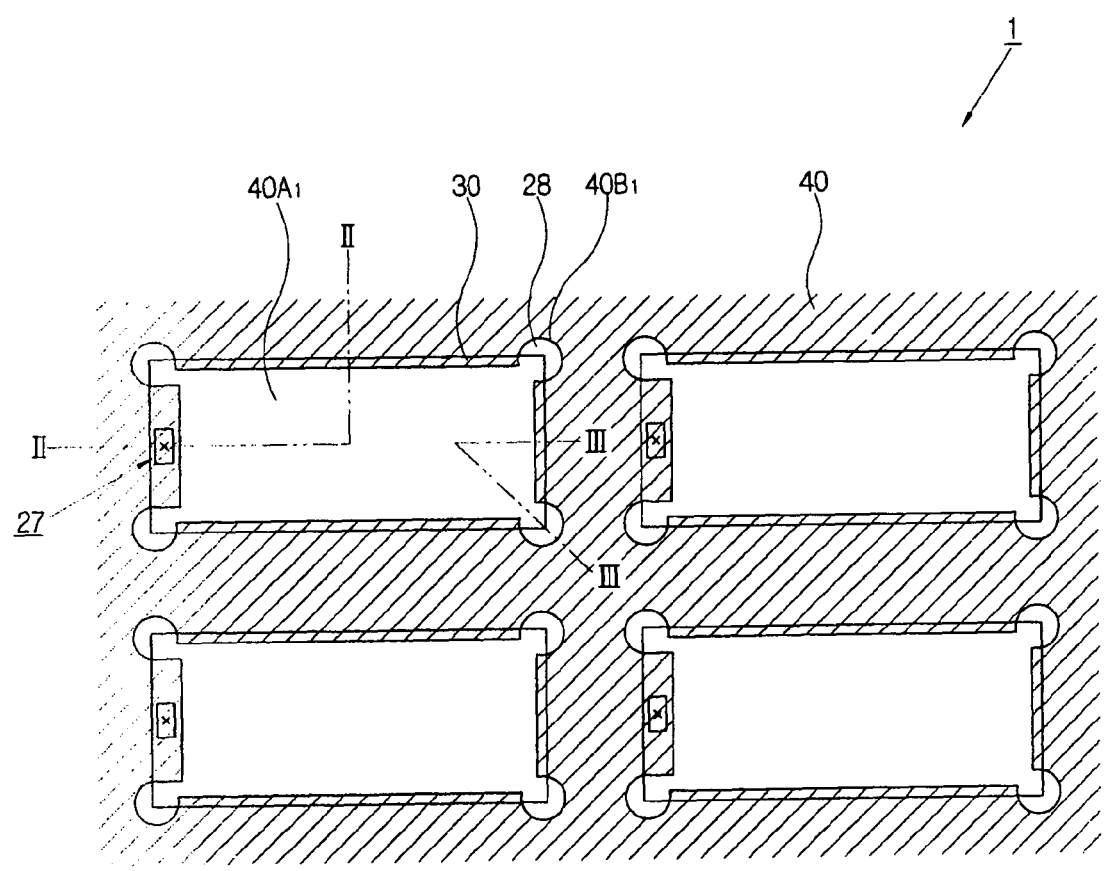
FIG. 1 schematically illustrates a display device according to a first embodiment of the invention.

Reference will now be made in detail to the embodiments of the present invention, examples of which are illustrated in the accompanying drawings, wherein like reference numerals refer to like elements throughout.

Figure 2:
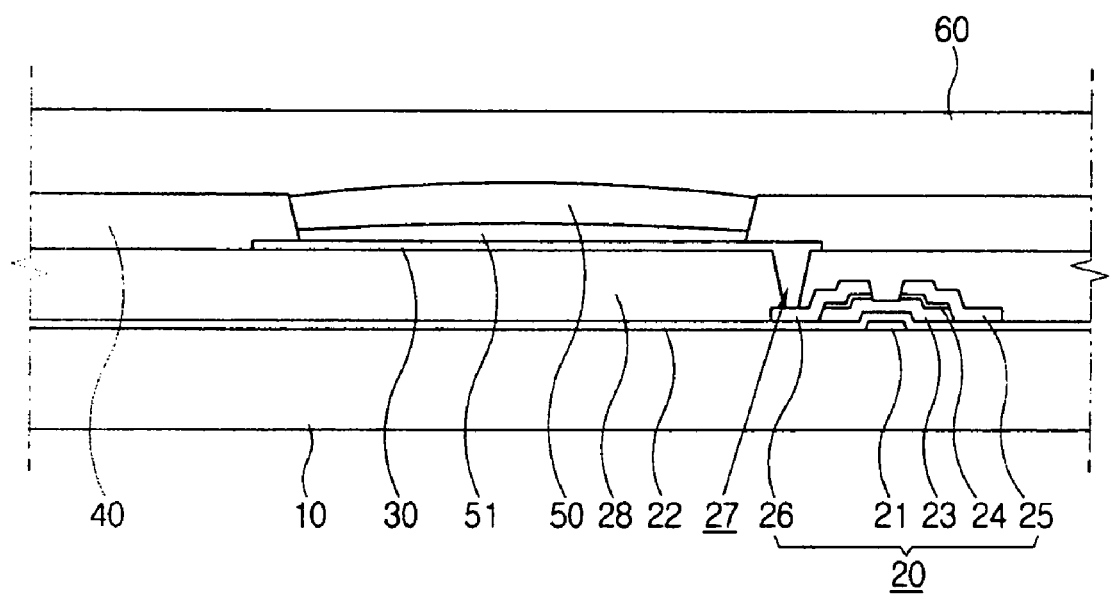
FIG. 2 is a sectional view taken along the line II-II in FIG. 1.
Figure 3:
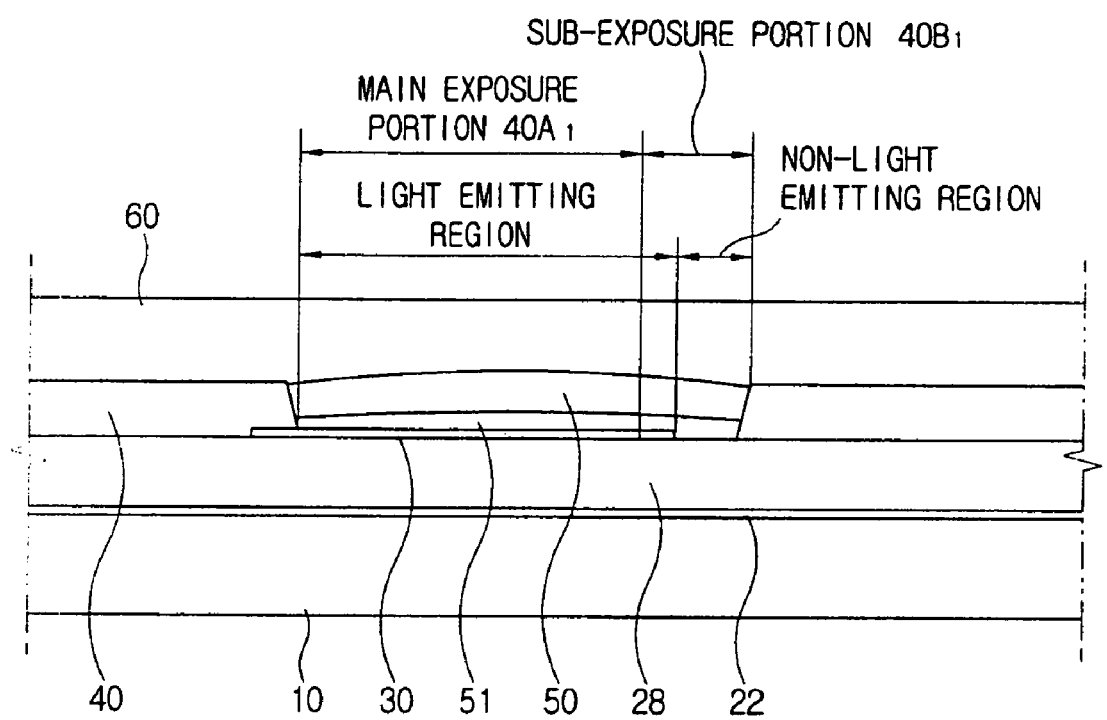
FIG. 3 is a sectional view taken along the line III-III in FIG. 1.

Referring to FIGS. 1 to 3, a first embodiment of the invention will be explained. FIG. 1 schematically illustrates a display device according to a first embodiment of the invention. FIG. 2 is a sectional view taken along the line II-II in FIG. 1, and FIG. 3 is a sectional view taken along the line III-III in FIG. 1. As illustrated in FIGS. 1 to 3, the display device 1 of this embodiment includes a plurality of thin film transistors 20, a protective film 28 covering the this film transistor 20, a pixel electrode 30 formed on the protective film 28 and electrically connected with the thin film transistor 20 through a contact hole 27, a partition wall layer 40 disposed between the pixel electrodes 30 and partitioning the pixel electrodes 30, and a light-emitting layer 50 formed in an exposed area between the partition wall layers, and a cathode or common electrode 60 formed on the light-emitting layer 50.

The first embodiment illustrates a thin film transistor 20 made of amorphous silicon, but may employ a thin film transistor made of polysilicon. Hereinafter, the thin film transistor 20 will be explained in detail. A gate electrode 21 is formed on a substrate 10 made of an insulation material such as glass, quartz, ceramic, plastic and the like. On the substrate 10 and the gate electrode 21 is formed a gate insulation film 22 made of silicon nitride (SiNx) or the like. On the gate insulation film 22 where the gate electrode 21 is placed, a semiconductor layer 23 made of amorphous silicon and an ohmic contact layer 24 made of n+ hydrogenated amorphous silicon doped with a high concentration of n-type impurity are formed in sequence. Here, the ohmic contact layer 24 is divided into two pieces with the gate electrode 21 placed in-between.

A source electrode 25 and a drain electrode 26 are formed on the ohmic contact layer 24 and the gate insulation film 22. The source electrode 25 and the drain electrode 26 are separated from each other with the gate electrode 21 placed in-between. A protective film 28 is formed on the source electrode 25, the drain electrode 26, and on top of the semiconductor layer 23 not covered by the electrodes 25 and 26. The protective film 28 may be formed of silicon nitride (SiNx) or/and an organic film. The protective film 28 is provided with a contact hole 27 formed to exposed the drain electrode 26.

Formed on the protective film 28 is a pixel electrode 30 having generally a rectangular shape. The pixel electrode 30 is also known as an anode and supplies positive holes to the light-emitting layer 50. The pixel electrode 30 is made of a transparent conductive material such as indium tin oxide (ITO), indium zinc oxide (IZO) or the like.

A partition wall layer 40 is formed between neighboring pixel electrodes 30, so that they are partitioned. The partition wall layer 40 includes a main exposure portion $40A_1$ exposing the pixel electrode 30 and a sub-exposure portion $40B_1$ protruded and extended from the main exposure portion $40A_1$. The partition wall layer 40 functions to prevent short-circuit between the pixel electrodes 30 and define a pixel region comprised of the main exposure portion $40A_1$ and the sub-exposure portion $40B_1$. The partition wall layer 40 covers the thin film transistor 20 and the pixel electrode 30 that is placed on the contact hole 27 to electrically connect the thin film transistor 20.

The partition wall layer 40 is extended over the main exposure portion $40A_1$ having generally a rectangular shape so as to extend beyond the periphery of the pixel electrode 30. The corner area of the main exposure portion $40A_1$ forms the sub-exposure portion $40B_1$ having generally a circular shape. In addition, the partition wall layer 40 may be formed, at least partially spaced apart from the pixel electrode 30, without overlapping with the periphery of the pixel electrode 30. Provision of a gap between the partition wall layer 40 and the pixel electrode 30 can prevent short-circuit between the pixel electrode 40 and the cathode or common electrode 60, which may occur in the corner area of the main exposure portion $40A_1$.

Conventionally, the partition wall layer 40 is formed in a rectangular shape having a right- or acute-angled corner, and thus embraces a problem that light-emitting materials 50 and 51 are not properly formed in the corner areas of the partition wall layer 40. In this embodiment of the invention, however, the sub-exposure portion $40B_1$ is curvilinear in form at the corners of the partition wall layer 40 such that the light-emitting materials 50 and 51 can be diffused adequately inwards of the sub-exposure portion $40B_1$. Thus, the light-emitting materials 50 and 51 can be formed on the corners of the rectangular pixel electrode 30, resulting in uniform light-emission.

The sub-exposure portion $40B_1$ may be formed in a planar shape having at least one curved line, and in this embodiment, has a circular shape. Thus, the sub-exposure portion $40B_1$ may be formed, including the circular shape, of a polygonal shape such as a rectangular and a trapezoid, an oval shape, or a combinational shape thereof, so long as it is protruded and extended to the corner area of the partition wall layer 40. The area of the sub-exposure portion $40B_1$ varies with how much the partition wall layer 40 extends beyond the pixel electrode 30 and the process margin, but preferably is within a range of about 5~15% of that of the main exposure portion $40A_1$. The sub-exposure portion $40B_1$ is formed in such a way that the partition wall layer 40 is partially spaced apart from the pixel electrode 30, and thus the protective film 28 is exposed through part of the sub-exposure portion 40B1.

On the exposed area of the protective film 28 are formed a positive hole injection layer 51 and a light-emitting layer 50. The portion where the pixel electrode 30 is not formed constitutes a non-light emitting region. Even if the light-emitting material is not adequately filled in the sub-exposure portion $40B_1$ so that the light-emitting layer 50 cannot be uniformly formed, the light-emitting material is sufficiently diffused onto the pixel electrode placed in the boundary area of the main exposure portion $40A_1$ and the sub-exposure portion $40B_1$, thus enabling a normal light-emitting. In addition, even though the light-emitting materials 50 and 51 are not properly formed in the area where the protective film 28 is exposed, short-circuit with the cathode or common electrode 60 does not occur because the pixel electrode 30 is not formed in that area.

As shown in FIGS. 2 and 3, the region where the main exposure portion is formed is the same as the conventional partition wall layer. That is, the edge area of the partition wall layer 40 is formed in such a way to partially overlap pixel electrode 30. Contact hole 27 connecting the thin film transistor 20 with the pixel electrode 30 is covered with the partition wall layer 40. As described above, the pixel electrode 30 and the partition wall layer 40 may be formed so as to be spaced apart from each other by a certain distance. The positive hole injection layer 51 and the light-emitting layer 50 are formed on the main exposure portion $40A_1$ between the partition wall layers 40.

In contrast, the region where the sub-exposure $40B_1$ is formed constitutes a non-light emitting area, as described above. The positive hole injection layer 51 and the light-emitting layer 50 are also formed on the non-light emitting area. Due to the light emitting materials 50 and 51 diffused into the sub-exposure portion $40B_1$, short-circuit between the pixel electrode 30 and the cathode or common electrode 60 is prevented.

Dissimilar to this embodiment, the pixel electrode 30 may be formed over the entire protective film 28, without exposing the protective film 28 to the sub-exposure portion 40B$_1$. If the light-emitting materials 50 and 51 are adequately formed in the sub-exposure portion 40B1, the light-emitting area is widened to thereby improve the aperture ratio effectively.

In addition, according to another embodiment of the invention, the partition wall layer 40 may be formed in multiple layers, or in a double-layer. In the case where the partition wall layer 40 is formed in a double-layer, the lower layer may be formed of a hydrophilic inorganic film, in particular SiO$_2$, and the upper layer may be formed of a hydrophobic organic film. Even if the hydrophilic light-emitting material is sprayed near the partition wall layer 40, it can be easily moved to the pixel electrode 30, since the upper layer is made of an organic material. The lower layer is hydrophilic so that the hydrophilic light emitting materials 50 and 51 can be formed in a stable manner.

Between the partition wall layers 40 are formed in sequence the positive hole injection layer 51 and the light-emitting layer 50. The positive hole injection layer 51 is formed of a positive hole injection material such as poly(3,4-ethylenedioxy-thiophene) (PEDOT) and polystyrenesulfone acid (PSS). This positive hole injection material is mixed with water to form a liquid suspension, which can be formed into the positive hole injection layer through an inkjet method.

The light-emitting layer 50 is formed on the positive hole injection layer 51. Positive holes transferred from the pixel electrode 32 and electrons transferred from the cathode or common electrode 60 are combined in the light-emitting layer 50 to form excitons, which emit light during deactivation process thereof. The light-emitting layer 50 is formed of a polymer material capable of emitting a blue light, a red light and a yellow light.

The common electrode 60 is positioned on the light-emitting layer 50. The common electrode 60 supplies electrons to the light emitting layer 50. The common electrode 60 may be formed of an opaque material such as aluminum. In this case, the light emitted from the light-emitting layer 50 is directed towards the substrate 10, which is known as a bottom emission mode.

Although not illustrated, the display device 1 may further include a positive hole transfer layer between the positive hole injection layer 51 and the light-emitting layer 50, and an electron transfer layer and an electron injection layer between the light-emitting layer 50 and the common electrode 60. In addition, the display device 1 may further include a protective film for protecting the common electrode 60 and an envelope member for preventing moisture and air from being penetrated into the light-emitting layer 50.

Figure 4:
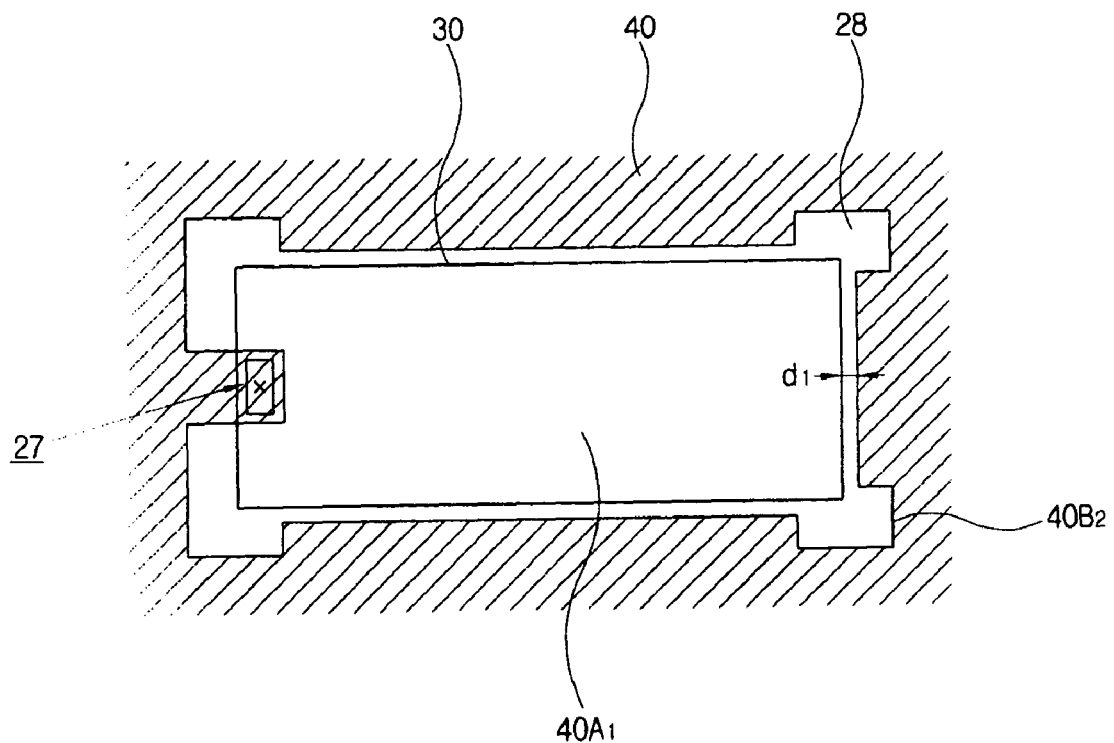
FIG. 4 illustrates a pixel region in a display device according to a second embodiment of the invention.

FIG. 4 illustrates a pixel region in a display device according to a second embodiment of the invention. As shown in FIG. 4, the partition wall layer 40 is formed spaced apart from the pixel electrode 30 by a certain distance. A pixel region is defined within an area exposed by the partition wall layer 40. The pixel region includes a main exposure portion 40A$_1$ having a rectangular shape along the periphery of the pixel electrode 40 and a sub-exposure portion 40B$_2$ of a rectangular shape protruded and extended from the main exposure portion 40A$_1$. The sub-exposure portion 40B$_2$ may be formed in a polygonal shape including the above rectangle, or in various plane forms containing a curved line such as a circle or an oval. The protective film 28 is exposed where not overlapped by the pixel electrode 30. The light-emitting layer 50 is formed in the pixel region between the partition wall layers 40. The top of the thin film transistor 20 and the contact hole 27 is covered with the partition wall layer 40, but the edge of the pixel electrode 30 is spaced apart from the partition wall layer 40, except for the portions where the contact hole 27 is placed. Since the pixel electrode 30 and the partition wall layer 40 are spaced apart from each other, the protective film 28 under the pixel electrode 30 is exposed and the positive hole injection layer 51 and the light-emitting layer 50 are formed in the exposed area of the protective film 28. Light is emitted from the pixel electrode 30 where the partition wall layer 40 is not formed, and the exposed area of the protective film 28 is not supplied with positive holes and thus constitutes a non-light emitting region.

The spacing d$_1$ of the non-light emitting region between the pixel electrode 30 and the partition wall layer 40 spaced apart from each other is in a range of 0.5~30 μm. This spacing d$_1$ may vary with the process margin, the aperture ratio, or the like. In addition, considering other wirings (not shown) formed adjacent to the pixel electrode 30, the spacing d$_1$ from the long side or the short side of the rectangle may be made to be different.

The light-emitting can be restricted by not forming the pixel electrode 30 and, thus, defective pixels can be prevented, which may occur in the edge areas of the pixel electrode 30. Even if the light-emitting materials are not sufficiently filled in the corners of the partition wall layer 40 to thereby result in a non-uniform light-emitting layer 50, a short circuit with the common electrode 60 does not occur because the pixel electrode 40 is not formed in those corners.

Figure 5:
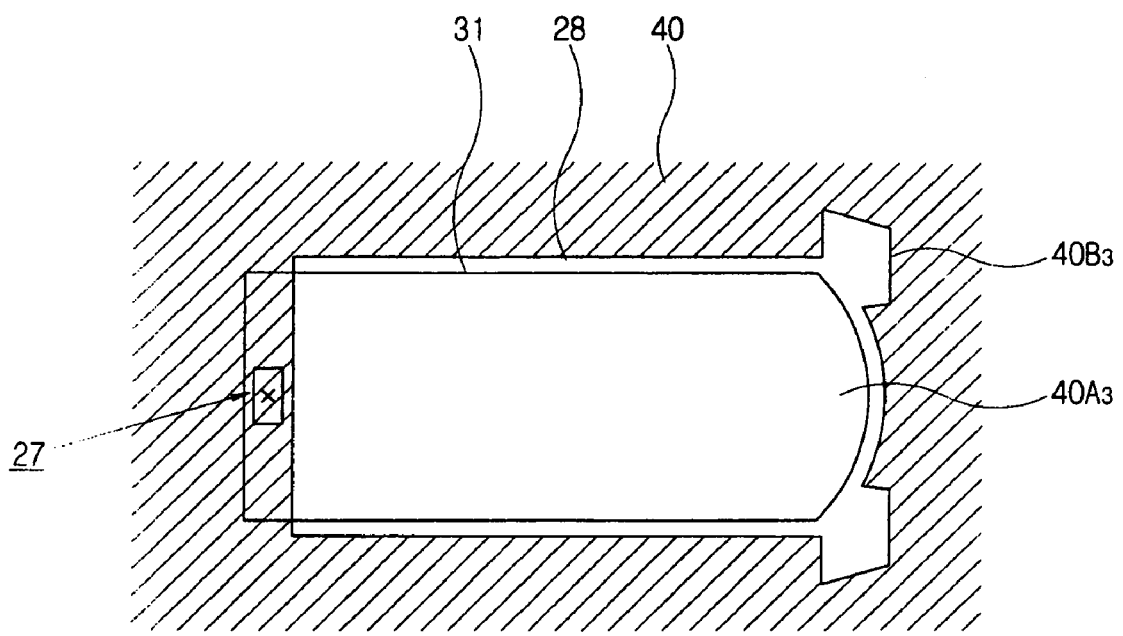
FIG. 5 illustrates a pixel region in a display device according to a third embodiment of the invention.

FIG. 5 illustrates a pixel region in a display device according to a third embodiment of the invention. As shown in FIG. 5, the main exposure portion 40A$_2$ has generally a rectangular shape, but one short side of the rectangular is made to be curved and the curvature of the curved side may vary. The sub-exposure portion 40B$_3$ is protruded and extended from the main exposure portion 40A$_2$ in the form of a trapezoid. Since a liquid tends to take a circular or oval shape due to its surface tension, the light-emitting layer 50 may not be adequately formed in the edge areas of the partition wall layer 40. In order to alleviate the above phenomenon, the edge area of the partition wall layer 40 is made to have a circular shape such that the light-emitting layer 50 can be completely filled in the pixel region.

The pixel electrode 31 has an oval shape having a circular corner, not a rectangular shape having a right-angled corner. In this way, the pixel electrode 31 is formed to have a circular shape, similar to the partition wall layer 40, thereby improving the aperture ratio and easily forming the partition wall layer 40 in the edge areas of the pixel electrode 31.

The shape of the pixel electrode 30, 31, and the configuration of the main exposure portion 40A$_1$, 40A$_2$ and the sub-exposure portion 40B$_1$, 40B$_2$, 40B$_3$ are not limited to the above-described embodiments, but may be modified to various ways, for example, a combination of the above embodiments.

Figure 6:
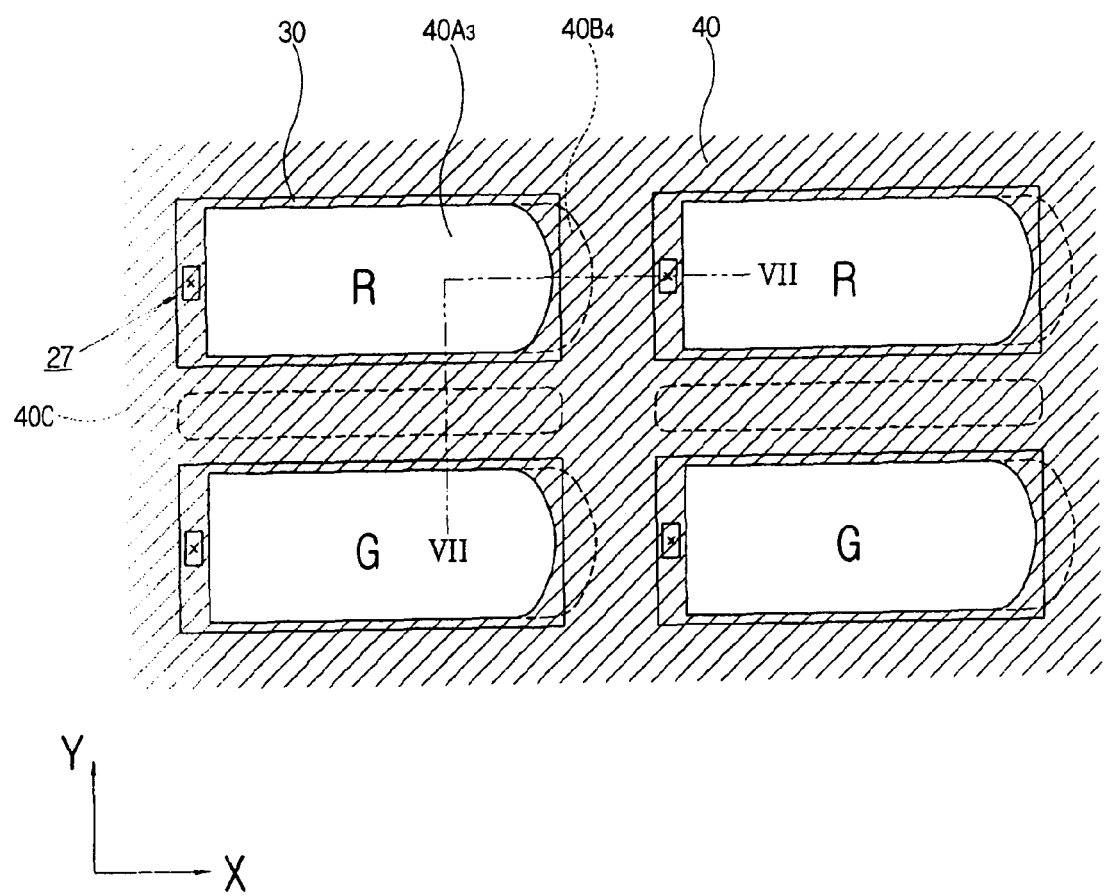
FIG. 6 schematically illustrates a display device according to a fourth embodiment of the invention.
Figure 7:
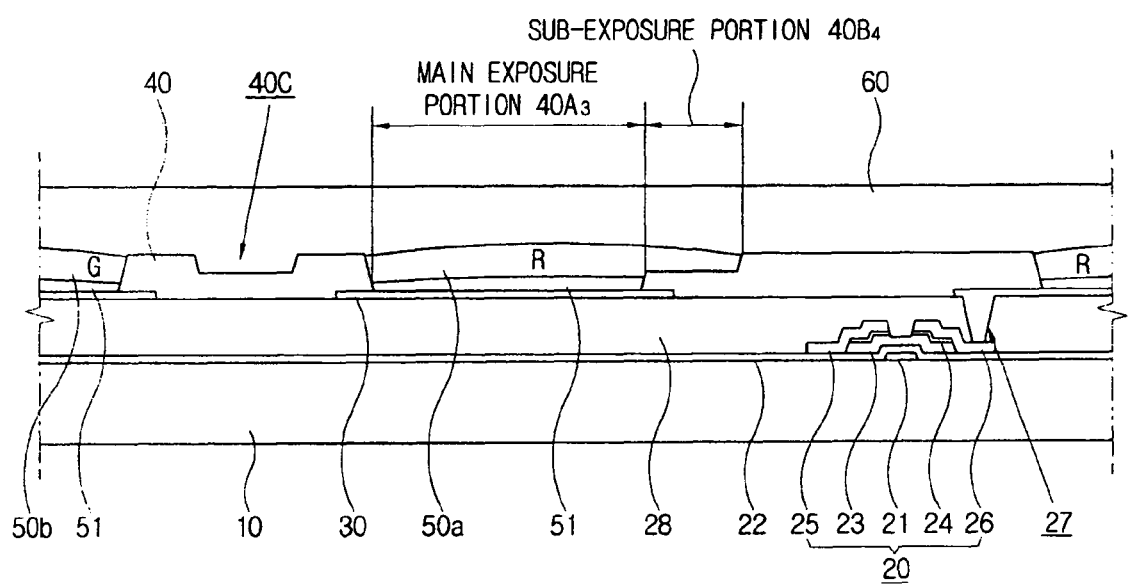
FIG. 7 is a sectional view taken along the line VII-VII in FIG. 6.

Hereafter, a fourth embodiment of the invention will be explained, referring to FIGS. 6 to 8. FIG. 6 schematically illustrates a display device according to a fourth embodiment of the invention. FIG. 7 is a sectional view taken along the line VII-VII in FIG. 6.

As illustrated, the display device 1 includes a pixel electrode 30 and a partition wall layer 40. The pixel electrode 30 has the form of a rectangle having a long side formed in the X-axis direction and a short side formed in the Y-axis direction. The partition wall layer 40 includes a main exposure portion 40A$_3$ having a rectangular shape, the corner of which is made to be curved, and a sub-exposure portion 40B$_4$ formed in the short side of the rectangle and having a stepped portion. In addition, a depressed portion 40C is formed in the partition wall layer 40 between the pixel electrodes 30 adjacent to each other in the Y-axis direction.

Light-emitting materials 50 and 51 are formed on a pixel region defined by the main exposure portion $40A_3$. On the pixel electrodes 30 adjacent in the X-axis direction are formed light-emitting layers emitting the same color (R or G). On the pixel electrodes 30 adjacent in the Y-axis direction are formed light-emitting layers emitting different colors (R, G).

The sub-exposure portion $40B_4$ of this embodiment is formed in such a way as to be protruded and extended from one side of the main exposure portion $40A_3$, (unlike the sub-exposure portions $40B_1$, $40B_2$ and $40B_3$ according to the previous embodiments which are formed so as to be protruded and extended from the corners of the main exposure portions $40A_1$ and $40A_2$). In addition, the sub-exposure portion $40B_4$ does not expose the pixel electrode 30 or the protective film 28, but is provided by forming a stepped portion in the partition wall layer 40.

In a case where the light-emitting materials 50 and 51 are formed on a pixel region using an inkjet method, the nozzle loaded with the light-emitting materials 50 and 51 moves in the X-axis direction along the long side of the rectangle to print the light-emitting materials 50 and 51 on the pixel region. The light-emitting materials 50 and 51 are pushed and dropped in the opposite direction to the nozzle movement, but may not be adequately dropped in the edge areas of the pixel region due to the partition wall layer. In order to solve this problem, in this embodiment, the sub-exposure portion $40B_4$ having a stepped portion formed in the corner area of the pixel region is formed, so that the light-emitting materials 50 and 51 dropped onto the sub-exposure portion $40B_4$ can be pushed towards onto the pixel electrode 30. Thus, the light-emitting materials 50 and 51 are completely filled in the main exposure portion $40A_3$ to thereby form a uniform light-emitting layer 50. This sub-exposure portion $40B_4$ is inherently provided in an area where the partition wall layer 40 is formed, and thus does affect the aperture ratio.

The above sub-exposure portion $40B_4$ may be formed in the long side edge of the main exposure portion $40A_3$, not only in the short side edge thereof. In addition, the stepped portion may be formed in the edge areas of the exposure portions of the previous first to third embodiments, such that the light-emitting materials 50 and 51 can be more efficiently dropped.

In a case where different materials (emitting different colored lights) are dropped in different X-direction pixel lines, the depressed portion functions to prevent color-mixing, which may occur between the neighboring pixel electrodes 30. If the light-emitting material is overly dropped onto the partition wall layer 40, different materials emitting different colors may be mixed with each other and then flow into the pixel electrode 30. The depressed portion accommodates this excessive light-emitting material. As shown in FIG. 7, on the pixel electrodes 30 at both sides of the depressed portion 40c, a red light-emitting layer 50a and a green light-emitting layer 50b are formed respectively.

In this embodiment, the depressed portion 40C is formed between the pixel electrodes 30 adjacent to each other in the Y-axis direction. In a case where light-emitting materials emitting a same color are dropped in the Y-axis direction, the depressed portion 40C is formed in the pixel electrodes 30 adjacent to each other in the X-axis direction. In addition, if light-emitting materials emitting different colors are dropped on different pixel electrodes adjacent to one another in the Y-axis and X-axis directions, the depressed portion 40C may be formed in the partition wall layer 40 between the respective pixel electrodes 30.

The sub-exposure portion $40B_4$ and the depressed portion 40C are formed in such a way that a slit mask is used to differentiate the degree of light-exposure during the vapor-deposition and photolithographic etching process for forming the partition wall layer 40. Without a slit mask, the developing solution and time may be varied to form a stepped area. The formation methods are not limited to the above-described ones.

Figure 8A:
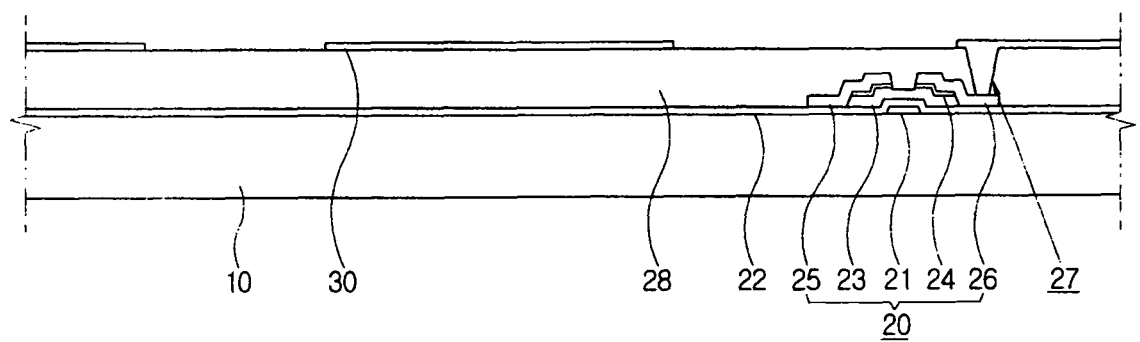
FIGS. 8a to 8d are sectional views explaining a method of manufacturing the display device according to the fourth embodiment of the invention.

FIGS. 8a to 8d explain a method of manufacturing the display device according to the fourth embodiment of the invention. First, as shown in FIG. 8a, the thin film transistor 20 is formed on the substrate 10. The thin film transistor 20 may be fabricated through a known process and its channel is formed of amorphous silicon. After forming the thin film transistor 20, the protective film 28 is formed on the thin film transistor 20. If the protective film 28 is formed of silicon nitride, it may be formed using a chemical vapor deposition method. Thereafter, the protective film 28 is photolithographic-etched to form the contact hole 27 exposing the drain electrode 26. After forming the contact hole 27, the pixel electrode 30 is formed such that it is connected with the drain electrode 26 through the contact hole 27. The pixel electrode 30 may be formed in such a manner that ITO is vapor-deposited using a sputtering technique and patterned. The pixel electrode 30 provides positive holes to the light-emitting layer and thus is also known as an anode electrode.

Figure 8B:
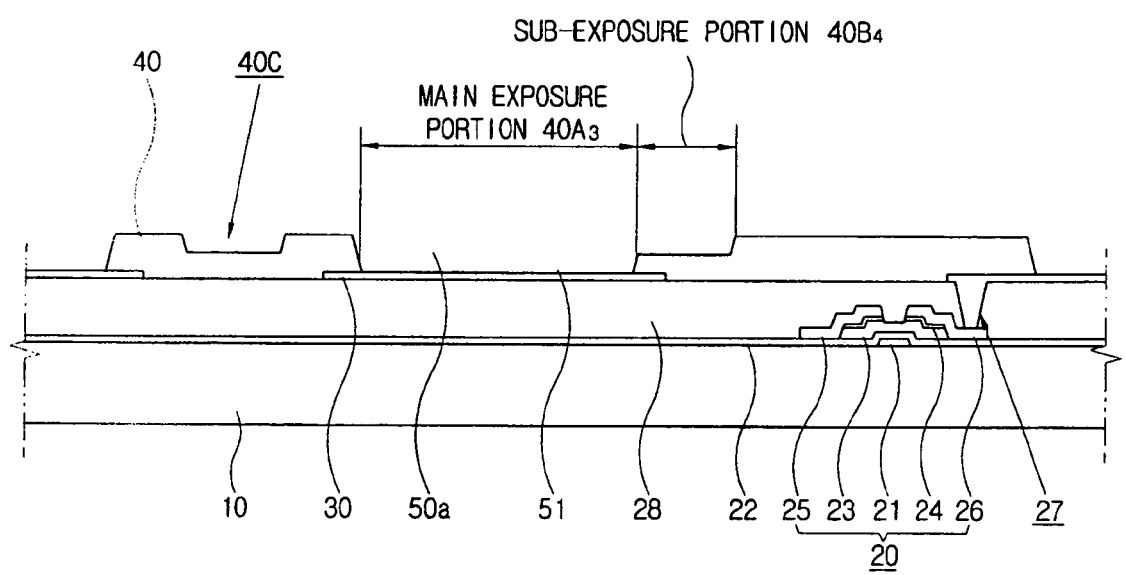

Thereafter, as shown in FIG. 8b, the partition wall layer 40 is formed between the neighboring electrodes 30. The partition wall layer 40 is formed of organic materials through vapor-deposition and photolithographic etching processes. The sub-exposure portion 40B4 and the depressed portion 40C are formed by vapor-depositing organic materials, which are then photolithographic-etched using a slit mask. That is, the degree of light-exposure is controlled to differentiate the thickness of the organic materials being developed. Due to the partition wall layer 40 formed above, the main exposure portion $40A_3$ exposing the pixel electrode 30 and the sub-exposure portion $40B_4$ are formed. In addition, the partition wall layer 40 is placed above the thin film transistor 20 and the contact hole 27. The partition wall layer 40 is formed such that its cross-section is gradually decreased towards the upper portion thereof.

Figure 8C:
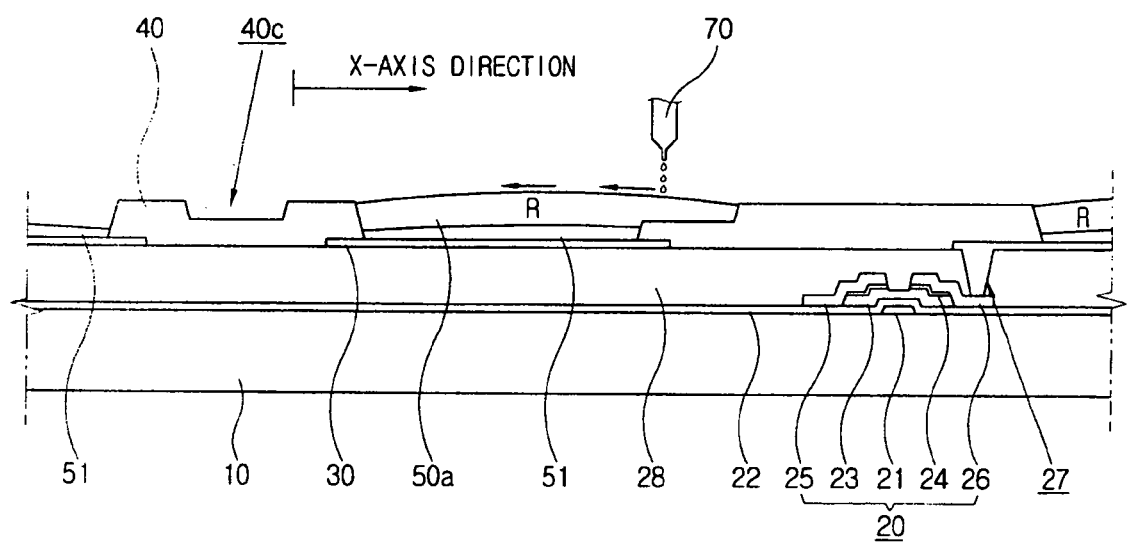

Then, as shown in FIG. 8c, the positive hole injection layer 51 is formed on the area in the pixel electrode 30 that is not covered by the partition wall layer 40. A red light-emitting layer 50a is formed in the X-axis direction. The positive hole injection layer 51 and the light-emitting layer 50a are formed using an inkjet method, where a nozzle 70 is used to drop a fluid, as illustrated in FIG. 8c. The nozzle 70 loaded with a positive hole injection material and a red light emitting ink moves on the substrate 10 in the X-axis direction to print the positive hole injection material and the light emitting ink in a desired place. The dropped positive hole injection material and light emitting ink are pushed in the opposite direction to the movement of the nozzle 70 and filled in the pixel region. The positive hole injection material and light emitting ink, which are dropped on the sub-exposure portion $40B_4$, is moved into the main exposure portion $40A_3$, thus forming a uniform light-emitting layer 50a. The red light emitting ink dropped on the partition wall layer 40 is accommodated in the depressed portion 40C. Although not illustrated, an apparatus for manufacturing the display device 1 further includes a controller (not shown) for controlling the movement of the nozzle 70 and the fluid dropping.

Figure 8D:
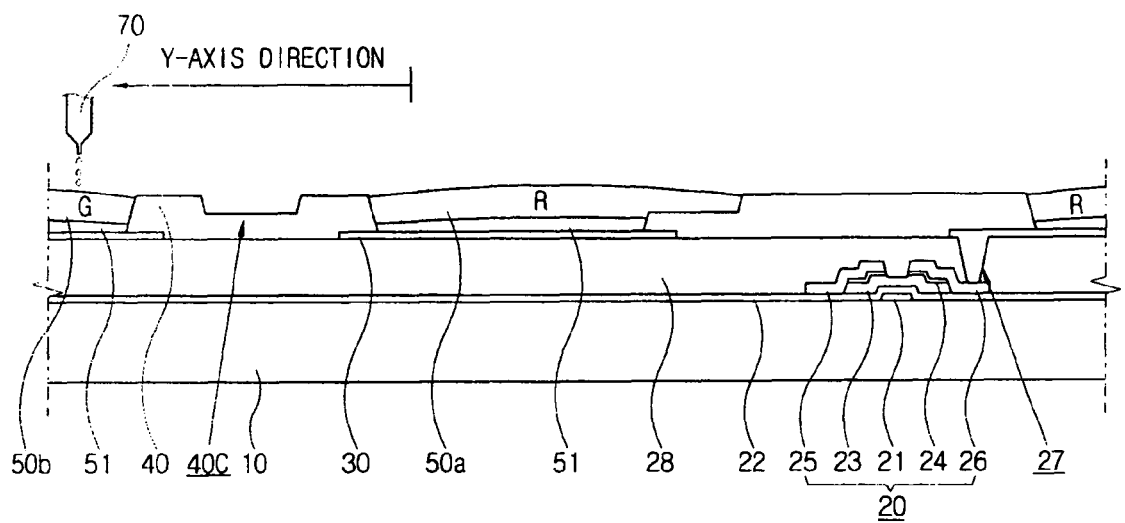

Thereafter, as shown in FIG. 8d, a green light emitting layer 50b is formed along the Y-axis direction. Although not illustrated, following the red and green inks, a blue light emitting ink is dropped. The depressed portion 40C is formed between the electrodes 30, where different light emitting inks are dropped. Even though the red and green light emitting inks are dropped and mixed in the depressed portion 40C, they do not affect the pixel regions emitting lights.

The positive hole injection layer 51 and the light-emitting layer 50 may be formed using a nozzle coating or spin coating technique, where each ink is dissolved in a solvent.

Hereafter, the common electrode 60 is formed on the light emitting layer 50, thereby completing the display device as shown in FIG. 7. As described above, the present invention provides a display device and a method of manufacturing the same, in which the light-emitting layer is uniformly formed. In addition, the present invention provides a display device and a method of manufacturing the same, in which color-mixing between the pixel regions can be prevented.

Although a few exemplary embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A display apparatus comprising:
    a plurality of thin film transistors;
    a protective film formed on the thin film transistor;
    a plurality of pixel electrodes formed on the protective film and electrically connected with the thin film transistors;
    a light-emitting layer formed on the pixel electrode,
    a partition wall layer partitioning the pixel electrodes adjacent to each other, the partition wall layer including a main recess portion exposing the pixel electrode and a sub recess portion protruded from the main recess portion, wherein the main and sub recess portion contains at least one portion of the light-emitting layer respectively;
    wherein at least a part of the pixel electrode is contacted with the light-emitting layer at the sub recess portion.

2. The display device as set forth in claim 1, wherein the area of the sub recess portion is within a range of about 5~15% of that of the main recess portion.

3. The display device as set forth in claim 1, wherein the sub recess portion has a plane form containing at least one of a straight line and a curved line.

4. The display device as set forth in claim 1, wherein the partition wall layer is formed in such a way that the partition wall layer is spaced apart from the pixel electrode in at least a part of the sub recess portion and is formed on the same layer as the pixel electrodes.

5. The display device as set forth in claim 1, wherein the protective film is exposed through at least a part of the sub recess portion.

6. The display device as set forth in claim 5, wherein the exposed portion of the protective film is covered with the light-emitting layer.

7. The display device as set forth in claim 1, wherein the pixel electrode is formed in the shape of a rectangle having a long side and a short side, at least one corner of the rectangle having a curved shape.

8. The display device as set forth in claim 1, wherein the pixel electrode is formed in the shape of a rectangle having a long side and a short side.

9. The display device as set forth in claim 1, wherein the sub recess portion comprises a stepped portion formed in at least a part of an edge of the partition wall layer.

10. The display device as set forth in claim 1, wherein the sub recess portion comprises a stepped portion formed in any one edge of the partition wall layer, and the light-emitting layer emitting a same color is formed on the pixel electrodes adjacent to each other with the stepped portion placed in-between.

11. The display device as set forth in claim 1, wherein a depressed portion is formed in at least a part of the partition wall layer.

12. The display device as set forth in claim 11, wherein the light-emitting layers are formed on the pixel electrodes adjacent to the depressed portion to emit different colors from each other.

13. The display device as set forth in claim 1, further comprising a common electrode formed on the light-emitting layer.

14. The display device as set forth in claim 1, wherein the pixel electrode has an oval shape.

15. The display device as set forth in claim 1, wherein a material of the partition wall layer in the main recess portion is the same as a material of the partition wall layer in the sub recess portion.

* * * * *